(12) United States Patent
Chapman et al.

(10) Patent No.: US 7,330,388 B1
(45) Date of Patent: Feb. 12, 2008

(54) SENSE AMPLIFIER CIRCUIT AND METHOD OF OPERATION

(75) Inventors: David Chapman, Shelburne, VT (US); Richard Parent, Shelburne, VT (US)

(73) Assignee: Cypress Semiconductor Corporation, San Jose, CA (US)

( * ) Notice: Subject to any disclaimer, the term of this patent is extended or adjusted under 35 U.S.C. 154(b) by 267 days.

(21) Appl. No.: 11/234,411

(22) Filed: Sep. 23, 2005

(51) Int. Cl.
*G11C 7/02* (2006.01)
(52) U.S. Cl. ................................. 365/207; 365/205
(58) Field of Classification Search ............. 365/207, 365/205, 203, 189.11
See application file for complete search history.

(56) References Cited

U.S. PATENT DOCUMENTS

| | | | |
|---|---|---|---|
| 4,472,792 A | 9/1984 | Shimohigashi et al. | |
| 4,539,658 A | 9/1985 | Shimohigashi et al. | |
| 4,592,022 A | 5/1986 | Shimohigashi et al. | |
| 4,634,901 A | 1/1987 | McElroy | |
| 4,646,267 A | 2/1987 | Shimohigashi et al. | |
| 4,709,353 A | 11/1987 | Shimohigashi et al. | |
| 4,825,417 A | 4/1989 | Seo | |
| 4,860,255 A | 8/1989 | Shimohigashi et al. | |
| 4,918,663 A | 4/1990 | Remington et al. | |
| 5,087,957 A | 2/1992 | Ishimura et al. | |
| 5,119,332 A | 6/1992 | Shimohigashi et al. | |
| 5,170,374 A | 12/1992 | Shimohigashi et al. | |
| 5,177,586 A | 1/1993 | Ishimura et al. | |
| 5,347,183 A | 9/1994 | Phelan | |
| 5,365,478 A | 11/1994 | Shimohigashi et al. | |
| 5,448,520 A | 9/1995 | Shimohigashi et al. | |
| 5,504,443 A | 4/1996 | Gross et al. | |
| 5,525,919 A | 6/1996 | Phelan | |
| 5,640,356 A | 6/1997 | Gibbs | |
| 5,689,457 A | 11/1997 | Shimohigashi et al. | |
| 5,696,727 A | 12/1997 | Tsukude et al. | |
| 5,732,037 A | 3/1998 | Shimohigashi et al. | |
| 5,808,951 A | 9/1998 | Shimohigashi et al. | |
| 5,821,799 A | 10/1998 | Saripella | |
| 5,828,614 A | 10/1998 | Gradinariu | |
| 6,031,779 A | 2/2000 | Takahashi et al. | |
| 6,046,924 A | 4/2000 | Isobe et al. | |
| 6,052,324 A | 4/2000 | Tobita | |
| 6,054,879 A | 4/2000 | Meng | |
| 6,229,745 B1 | 5/2001 | Nambu et al. | |
| 6,236,606 B1 * | 5/2001 | Mullarkey et al. | 365/207 |
| 6,373,766 B1 * | 4/2002 | Birk | 365/207 |
| 6,404,036 B2 | 6/2002 | Maruyama | |
| 6,469,546 B2 * | 10/2002 | Matano | 327/51 |
| 6,654,309 B1 | 11/2003 | Hirose | |
| 6,781,915 B2 | 8/2004 | Arimoto et al. | |
| 7,224,629 B2 * | 5/2007 | Akiyama et al. | 365/208 |

* cited by examiner

*Primary Examiner*—Anh Phung
(74) *Attorney, Agent, or Firm*—Haverstock & Owens, LLP

(57) ABSTRACT

In one arrangement, a semiconductor memory device can include a sense amplifier circuit (300) having drive high transistors (P30/P31), drive low transistors (N31/N32) and equalization transistors (N33-N35). Such transistors can have a body bias (VbiasN, VbiasP) that varies according to the operation conditions of the semiconductor memory device. Such variations can include any of: manufacturing process variations, operating temperature, or operating voltage.

20 Claims, 6 Drawing Sheets

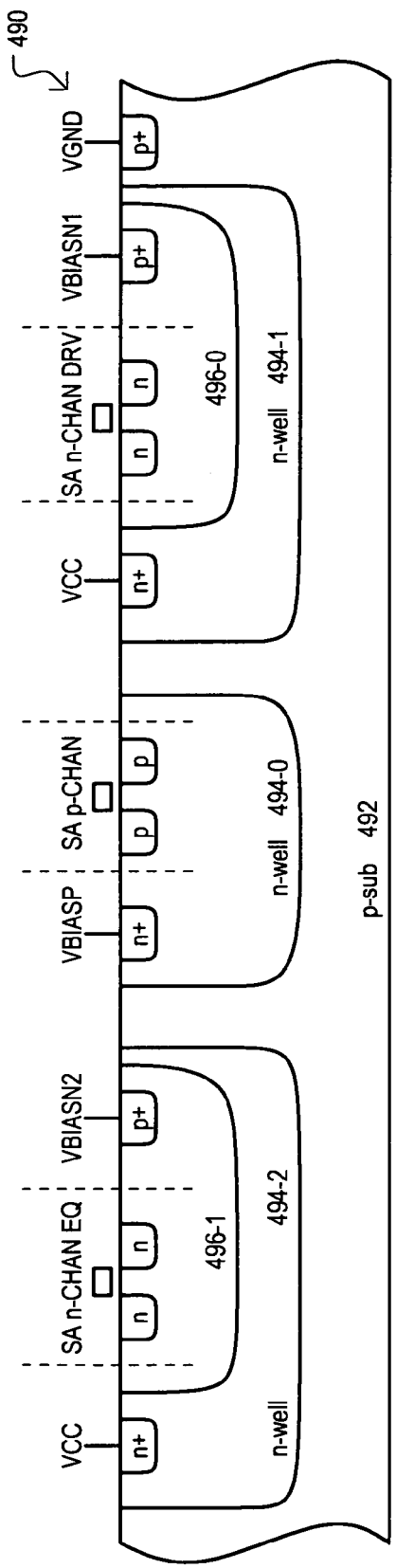
FIG. 4D
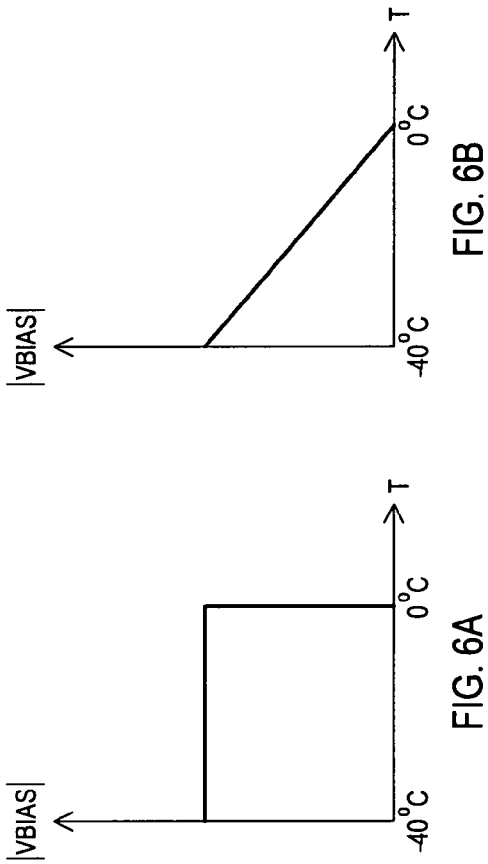
FIG. 6A
FIG. 6B
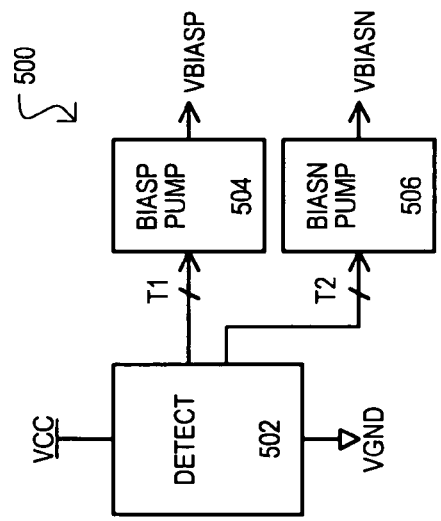
FIG. 5

SENSE AMPLIFIER CIRCUIT AND METHOD OF OPERATION

TECHNICAL FIELD

The present invention relates generally to memory devices and more particularly to sense amplifier circuits for memory devices.

BACKGROUND OF THE INVENTION

Semiconductor memory devices, including but not limited to dynamic random access memories (DRAMs), static RAMs (SRAMs), and "pseudo" SRAMs (pSRAMS) typically include a number of memory cells that can be accessed in order to read data, write data, and/or refresh data. In such operations, a sense amplifier circuit can be utilized to sense the data value stored by an accessed memory cell.

While a semiconductor memory device may be designed to operate under some nominal set of conditions (e.g., temperature, power supply voltage), in actual applications such a device may have to operate under a wide range of conditions. At the extremes of such operating conditions, a semiconductor memory device may operate at unacceptably low speeds, or may operate erroneously.

One such adverse effect will now be described with reference to a conventional semiconductor memory device. Referring now to FIG. 8, a conventional memory device is shown in a schematic diagram and designated by the general reference character 800. A memory device 800 can include an array of memory cells 802, a sense amplifier circuit 804, and bit line (BL) multiplexer (MUX) circuits 806-0 and 806-1. In the particular example shown, an array of memory cells 802 can include DRAM memory cells, each of which includes a pass transistor and storage capacitor.

Selected of the memory cells of array 802 can be connected to a pair of bit lines 808-0 and 808-1. Bit line pair 808-0/1 can be connected to a sense amplifier circuit 804 by BL MUX circuit 806-0. FIG. 8 shows a shared sense amplifier arrangement, thus it is understood that BL MUX circuit 806-1 can connect a second bit line pair (not shown) to the same sense amplifier circuit 804.

Sense amplifier circuit 804 can include a pair of n-channel transistors N1/N2 and p-channel transistors P1/P2 arranged in a cross-coupled fashion between sense nodes 810-0 and 810-1. As is well understood, in a cross-coupled arrangement, a first transistor can have a gate coupled to the drain of a second transistor, and the second transistor can have a gate connected to the drain of the first transistor. N-channel sense transistors N1/N2 can be enabled (i.e., driven) by a signal "setn". P-channel sense transistors P1/P2 can be enabled (i.e., driven) by a signal "setp".

Sense amplifier circuit 804 can also include an equalization circuit formed by n-channel transistors N3/N4/N5. Equalization circuit N3/N4/N5 can be enabled by an equalization signal "bleql". When activated, equalization circuit N3/N4/N5 can equalize sense amplifier nodes 810-0/1 to an equalization voltage "vbleq".

FIG. 9 is a cross sectional representation of the circuit shown in FIG. 8. In the example shown, n-channel transistors (N1-N5) of the sense amplifier circuit 804, as well as the n-channel transistors of the BL MUXs (N6-N9) can be formed in a p-type substrate 902. P-channel transistors (P1-P2) of the sense amplifier circuit 804 can be formed in an n-type well 904 formed within p-type substrate 902. A p-type substrate 902 can be biased to a low power supply voltage VGND. An n-type well 904 can be biased to a high power supply voltage VCC.

FIG. 9 also illustrates how n-channel pass transistors within a memory cell array 802 can be formed in a p-type substrate 902. However, other arrangements are known, such as "triple well" arrangements in which a memory cells of array 802 can be formed a p-well formed within an n-well formed within a p-type substrate 902. In such arrangements, the p-well containing the memory cell can be "back" biased to a negative potential $V_{BB}$.

While a conventional memory device like that illustrated in FIGS. 8 and 9 can operate adequately at nominal conditions, such a conventional arrangement can suffer from drawbacks at less than nominal conditions. One such drawback is illustrated in FIG. 10.

FIG. 10 is a timing diagram showing the response of the circuit shown in FIGS. 8 and 9 at an operating voltage and/or temperature lower than a nominal value. As shown by the figure, under such conditions, a bit line (in this case bit line $BL_C$) may be driven to a sensed value at an undesirably slow rate. Said in another way, such a conventional sensing operation can "stall".

The adverse effects of such operational conditions can be addressed in a number of conventional ways. In some cases, device operation is simply not ensured at lower temperatures and/or operating voltages. Such an approach undesirably limits the possible applications of the memory device.

In other conventional approaches, the transistors of a sense amplifier circuit can be fabricated to have lower threshold voltages than other transistors in the device. Such an approach adds complexity to the fabrication process, and may not always address a stall condition, particularly at substantially lower temperatures (e.g., less than 0° C.).

In light of the above, it would be desirable to arrive at some way of addressing sense amplifier response at lower temperatures and/or operating voltages that does not have the above drawbacks of conventional approaches.

SUMMARY OF THE INVENTION

The present invention can include a semiconductor memory device having a drive high circuit. A drive high circuit can sense a potential on one or more bit lines, and in response, drive at least one bit line toward a high sense voltage. The drive high circuit can include at least one pull-up insulated gate field effect transistor (FET) of a first conductivity type having a body biased to a boosted high voltage. The semiconductor memory device can also include a logic section comprising a plurality of transistors of the first conductivity type having bodies biased to a high supply voltage. In addition, a condition sense circuit can increase the boosted high voltage to a level above the high supply voltage when an effective operating temperature is determined to be less than a predetermined limit.

In this way, sense amplifier performance can be modulated by altering a body bias in response to an effective operating temperature of the semiconductor memory device.

According to one aspect of the embodiments, a drive high circuit can include cross-coupled pull-up p-channel FETs. Each pull-up PFET can be formed within an n-well coupled to the boosted high voltage and have source-drain paths coupled between one bit line and the high sense voltage.

In this way, a sense amplifier pull-up operation can be modulated to improve performance over effective operating temperature ranges.

According to another aspect of the embodiments, a semiconductor memory device can further include a drive low circuit that drives the at least one bit line toward a low sense voltage in a sense operation. The drive low circuit can have at least one pull-down FET of a second conductivity type having a body biased to a first boosted low voltage. The logic section can include a plurality of transistors of the second conductivity type having bodies biased to a low supply voltage. The temperature sense circuit can decrease the boosted low voltage to a level below the low supply voltage when the operating temperature is determined to be less than the predetermined limit.

According to another aspect of the embodiments, a drive low circuit can include cross-coupled pull-down n-channel FETs. Each pull-down NFET can be formed within a p-well coupled to the boosted low voltage and have source-drain paths coupled between one bit line and the low sense voltage.

In this way, a sense amplifier pull-down operation can be modulated to improve performance over effective operating temperature ranges.

According to another aspect of the embodiments, a semiconductor memory device can also include an equalization circuit that couples adjacent bit lines to an equalization voltage. The equalization voltage can be at a level between the high supply voltage and a low supply voltage. The equalization circuit can include at least one equalization FET of a second conductivity type having a body biased to a second boosted low voltage. A second boosted low voltage can vary as described above.

According to another aspect of the embodiments, an equalization FET can be formed within a p-well coupled to the boosted high voltage and have a source-drain path coupled between two bit lines.

In this way, a sense amplifier equalization operation can be modulated to improve performance over effective operating temperature ranges.

The present invention can also include a semiconductor memory device having a sense amplifier circuit and a bias voltage control circuit. A sense amplifier circuit can include first and second transistors of a first conductivity type formed in a first substrate section of a second conductivity type that are cross-coupled between sense amplifier nodes. Also included are first and second transistors of a second conductivity type formed in a second substrate section of a first conductivity type that are cross-coupled between the sense amplifier nodes. A bias voltage control circuit can be coupled to the first substrate section and can vary a bias voltage to the first substrate section based on at least one operating condition of the semiconductor memory device.

In this way, a sense amplifier can include cross coupled transistor pairs of different conductivity types, with at least one of the pairs having their bodies biased according to operating conditions of the memory device.

According to one aspect of the embodiments, a semiconductor memory device receives a low power supply voltage at an external connection. In addition, first and second transistors can be n-channel insulated gate field effect transistors and the first substrate section is of a p-type conductivity. A bias voltage control circuit can be configured to vary the bias voltage to the first substrate section to a potential below the low power supply voltage.

According to another aspect of the embodiments, a sense amplifier circuit can further include at least one equalization n-channel transistor formed in the first substrate section having a source-drain path coupled between the sense amplifier nodes.

In such an arrangement, equalization transistors and pull-down n-channel transistors can share a common substrate section (e.g., p-well).

According to another aspect of the embodiments, a semiconductor memory device can receive a high power supply voltage at an external connection. First and second transistors can be p-channel FETs and the first substrate section can be of an n-type conductivity. A bias voltage control circuit can be configured to vary the bias voltage to the first substrate section to a potential above the high power supply voltage.

According to another aspect of the embodiments, a bias voltage control circuit can vary the bias voltage to a level outside the range of received power supply voltages when a temperature is determined to be lower than a predetermined limit. The predetermined limit can be less than or equal to 0° C.

According to another aspect of the embodiments, an operating condition can include any of the following: manufacturing process variations of the semiconductor memory device, operating voltage of the semiconductor memory device, and operating temperature of the semiconductor memory device.

According to another aspect of the embodiments, a semiconductor memory device can further include a bit line coupled to at least one of the sense amplifier nodes, and a plurality of dynamic random access memory (DRAM) cells coupled to the bit line. Each DRAM cell can include a storage capacitor and a pass transistor.

In this way, the sensing of DRAM cell data can be improved over temperature and other device variations.

The present invention can also include a method of activating a sense amplifier circuit of a semiconductor memory device. The method can include sensing a temperature of the semiconductor memory device and modulating the threshold voltage of at least a first pair of sense transistors. Such a modulation can include biasing a substrate containing the first pair of sense transistors to a potential outside of a power supply voltage range. A power supply voltage range can be the range between a high power supply voltage and low power supply voltage received by the semiconductor memory device at external connections. The first pair of sense transistors can be cross-coupled between sense nodes of a sense amplifier.

According to one aspect of the embodiments, the step of sensing a temperature of the semiconductor memory device can include determining that the temperature is below a predetermined limit.

According to another aspect of the embodiments, modulating the threshold voltage can include biasing the substrate containing the first pair of sense transistors to a potential below the low power supply voltage.

According to another aspect of the embodiments, modulating the threshold voltage can include biasing the substrate containing the first pair of sense transistors to a potential above the high power supply voltage.

According to another aspect of the embodiments, a method can further include modulating the threshold voltage of a second pair of sense transistors of a different conductivity type than the first pair of sense transistors by biasing a substrate containing the second pair of sense transistors to another potential outside of the power supply voltage range.

According to another aspect of the embodiments, a method can further include modulating the threshold voltage of at least one equalization transistor by biasing a substrate containing the at least one equalization transistor to a potential outside of the power supply voltage range. An equalization transistor can have a source-drain path coupled between the nodes of the sense amplifier.

According to another aspect of the embodiments, a method can further include biasing a substrate of the semiconductor memory device containing a plurality of dynamic random access memory (DRAM) cells independently of the substrate containing the first pair of sense transistors.

In this way, sense amplifier body biasing is independent of any memory array biasing, such as a memory cell back bias voltage $V_{BB}$.

BRIEF DESCRIPTION OF THE DRAWINGS

FIGS. 4A to 4D are side cross sectional views illustrating biasing arrangements of sense amplifier circuits according to embodiments of the present invention.

FIG. 5 is a block schematic diagram of a condition sense section according to an embodiment of the present invention.

FIGS. 6A and 6B are graphs showing sample responses for a conditions sense section according to embodiments of the present invention.

DETAILED DESCRIPTION

Various embodiments of the present invention will now be described in detail with reference to a number of drawings. The embodiments show a semiconductor memory device having a sense amplifier that can provide a faster and/or more reliable response than conventional arrangements.

Figure 1:
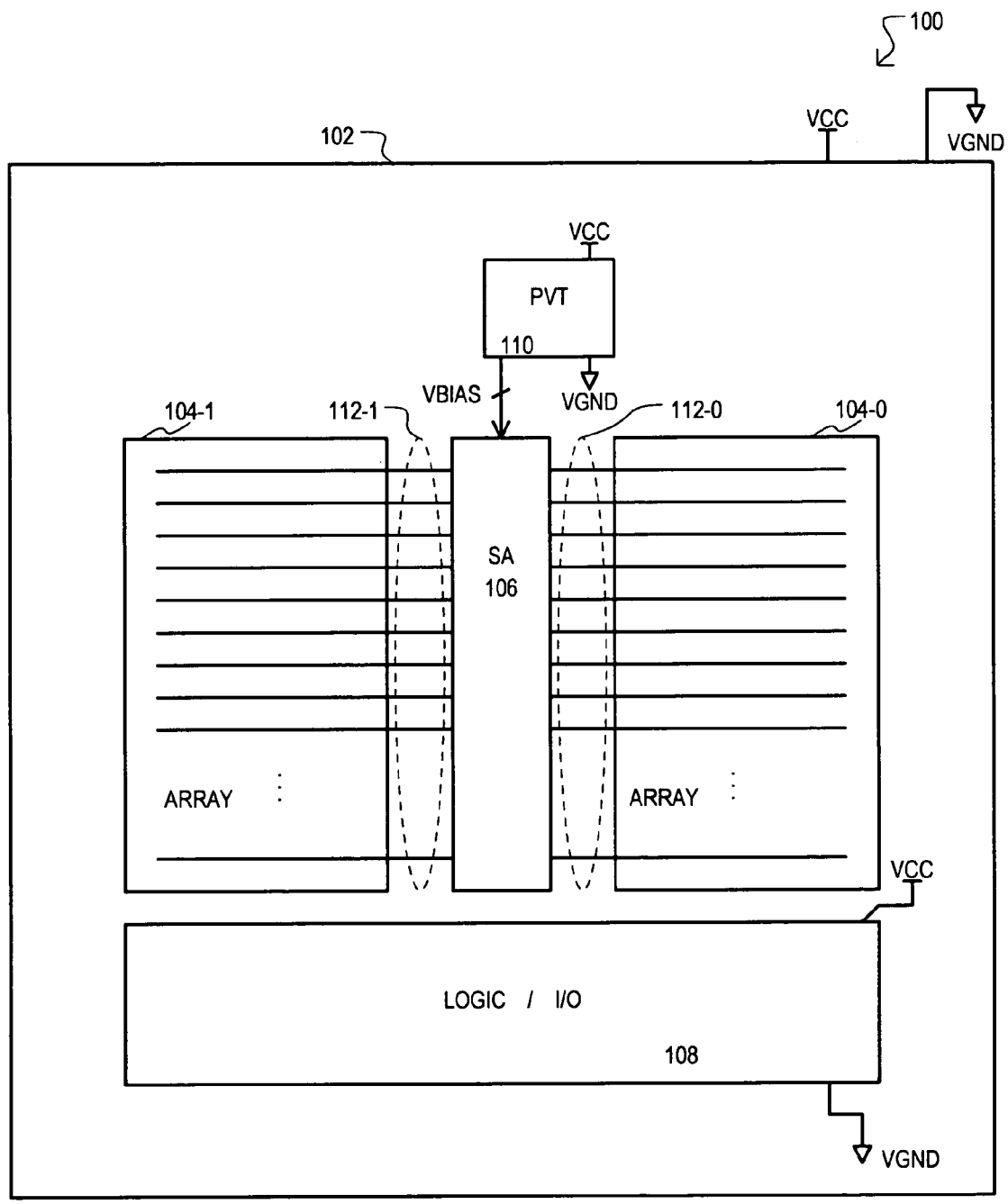
FIG. 1 is a block schematic diagram of a semiconductor memory device according to a first embodiment.

A semiconductor memory device according to a first embodiment is set forth in FIG. 1, and designated by the general reference character 100. It is understood that memory device circuits that are well known have been excluded from the figure for clarity and to avoid unduly cluttering the view. Further, FIG. 1 should not be considered a plan view. A memory device 100 can include a number of circuit sections formed on a substrate 102, including one or more memory cell arrays 104-0 and 104-1, a sense amplifier section 106, a logic section 108, and a condition sense section 110.

A memory cell array (104-0 and 104-1) can include a number of memory cells for storing data. Such memory cells are preferably dynamic random access memory (DRAM) memory cells, each having a storage capacitor coupled to a bit line by a pass transistor. However, such an arrangement should not necessarily be construed as limiting to the present invention.

Bit lines 112-0 and 112-1 can be connected to a sense amplifier section 106. A sense amplifier section 106 can amplify data values present in bit lines (112-0 and 112-1). However, unlike conventional arrangements, a sense amplifier section 106 can receive one or more substrate bias voltages VBIAS. Such substrate bias voltages can be outside a received power supply range for the memory device 100. In the particular example of FIG. 1, a memory device 100 can receive a high power supply voltage VCC and a low power supply voltage VGND via external connections. Thus, a bias voltage received by sense amplifier section 106 can be lower than a lower power supply voltage VGND and/or higher than a high power supply voltage VCC.

A logic section 108 can perform a variety of logic functions (e.g., I/O, timing, command decoding, etc.). A logic section 108 can operate at non-boosted voltages, having circuits that operate between a high power supply voltage VCC and low power supply voltage VGND.

A condition sense section 110 can receive power supply voltages VCC/VGND and generate one or more substrate bias voltages VBIAS for sense amplifier section 106. More particularly, a condition sense section 110 can generate one or more substrate bias voltages VBIAS based on operating conditions of a semiconductor memory device 100. For example, when the operating temperature of the memory device 100 is determined to be lower than some predetermined limit, a condition sense section 110 can generate a bias voltage of greater magnitude (e.g., more negative than VGND and/or more positive than VCC). The generation of such substrate bias voltages can be gradual, or step wise, or some other function. Further, the generation of a bias voltage can be based on an operating condition for the memory device and/or the effect of manufacturing process variations on the memory device 100.

In this way, a sense amplifier section 106 can receive a substrate bias voltage outside the range of a supplied power supply voltage. Such a substrate bias voltage can alter the driving capabilities of sense amplifier circuits to compensate for adverse effects of temperature extremes, operating voltage extremes, and/or process variation extremes. As but one particular example, a bias voltage can enable sense amplifier circuits to avoid "stalls" at lower operating conditions.

Figure 2A:
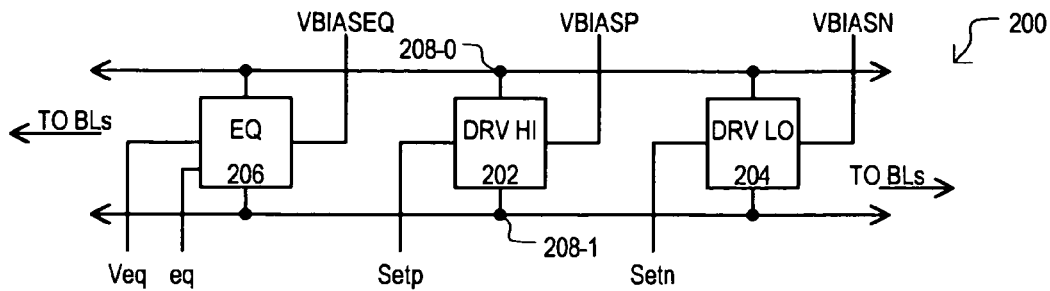
FIGS. 2A to 2C are block schematic diagrams of a sense amplifier circuits according to embodiments of the present invention.
Figure 2B:
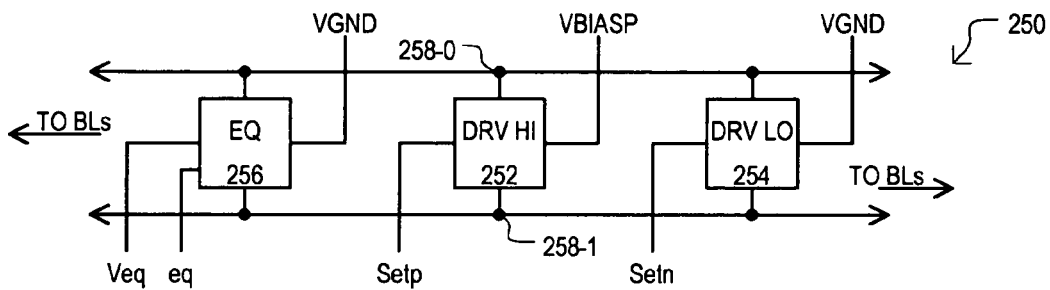
Figure 2C:
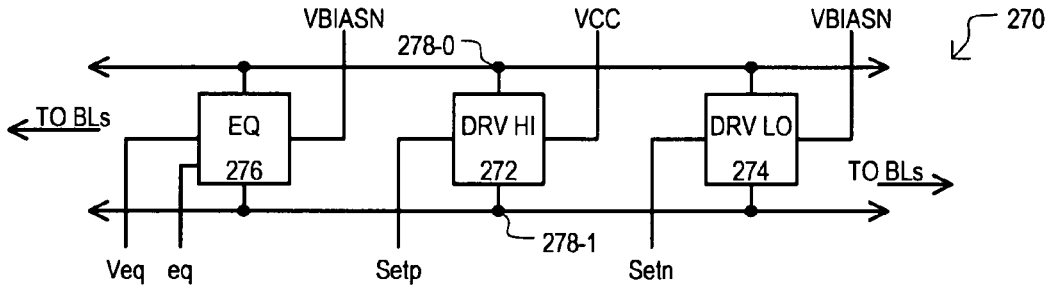

Referring now to FIGS. 2A to 2C, various examples of sense amplifier circuit arrangements are set forth in a series of block schematic diagrams. FIGS. 2A to 2C can be considered related to FIG. 1 in that such circuits, in particular embodiments, can be included in a sense amplifier section 106.

FIG. 2A shows a sense amplifier circuit 200 that includes a drive high section 202, a drive low section 204 and an equalization section 206 coupled between sense amplifier nodes 208-0 and 208-1. A drive high section 202 can drive one of nodes 208-0/1 toward a high potential based on a differential voltage between sense nodes 208-0/1. Similarly, a drive low section 204 can drive one of nodes 208-0/1 toward a low potential based on the differential voltage between nodes 208-0/1. An equalization section 206 can equalize the sense nodes to a same potential (Veq) prior to a sensing operation.

In the particular example of FIG. 2A, each of a drive high section 202, a drive low section 204 and an equalization section 206 can receive substrate bias voltages VBIASP, VBIASN, and VBIASEQ, respectively. Further, such substrate bias voltages (VBIASP, VBIASN, and VBIASEQ) can be varied to be outside a received power supply voltage range. Thus, circuit components (e.g., transistors) within such sections can be operated in such a fashion so as to counteract the effects of adverse operating conditions.

FIG. 2B shows the same general circuit components as FIG. 2A, thus like sections are referred to by the same reference character but with the first two digits being "25" instead of "20". FIG. 2B shows an arrangement in which a drive high section 252 can receive a substrate bias voltage VBIASP, while the drive low section 254 and equalization section 256 can receive a low power supply voltage VGND as a substrate bias voltage. Thus, in this arrangement, only circuit components within drive high section 252 can operate to counteract the effects of adverse operating conditions.

FIG. 2C shows the same general circuit components as FIG. 2A, thus like sections are referred to by the same reference character but with the first two digits being "27" instead of "20". FIG. 2C shows an arrangement in which a drive high section 272 receives a high power supply voltage VCC as a bias voltage. A drive low section 274 and equalization section 276 can receive a bias voltage VBIASN. Thus, in this arrangement, circuit components within such sections (274 and 276) can operate to counteract the effects of adverse operating conditions.

It is noted that in yet another arrangement, only a drive low section can receive a bias voltage.

In this way, various different sections of a sense amplifier circuit can receive substrate bias voltages outside of a power supply range.

Figure 3:
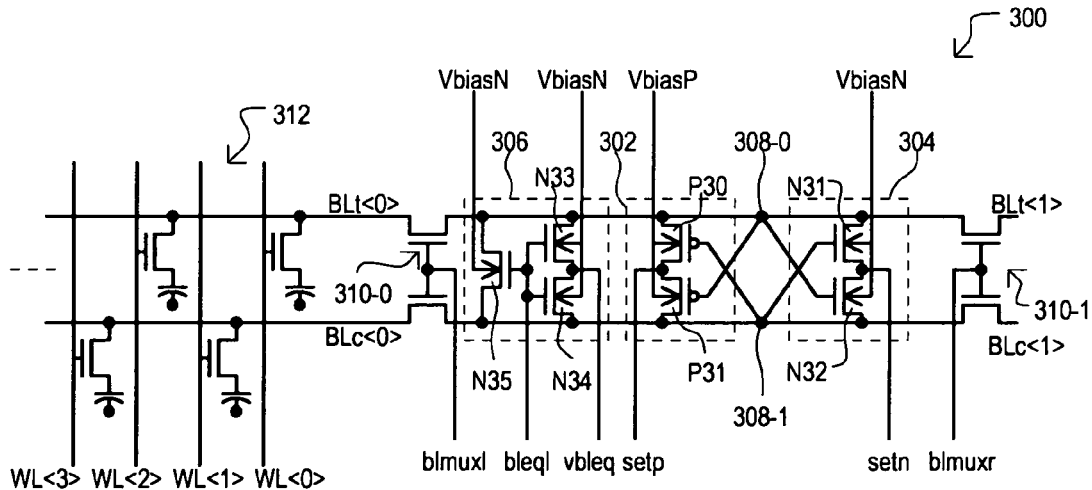
FIG. 3 is a schematic diagram showing a sense amplifier circuit according to another embodiment of the present invention.

Referring now to FIG. 3, a sense amplifier circuit according to another embodiment is shown in a schematic diagram. FIG. 3 shows the same general circuit components as FIG. 2A, thus like sections are referred to by the same reference character but with the first digit being "3" instead of "2".

Figure 8:
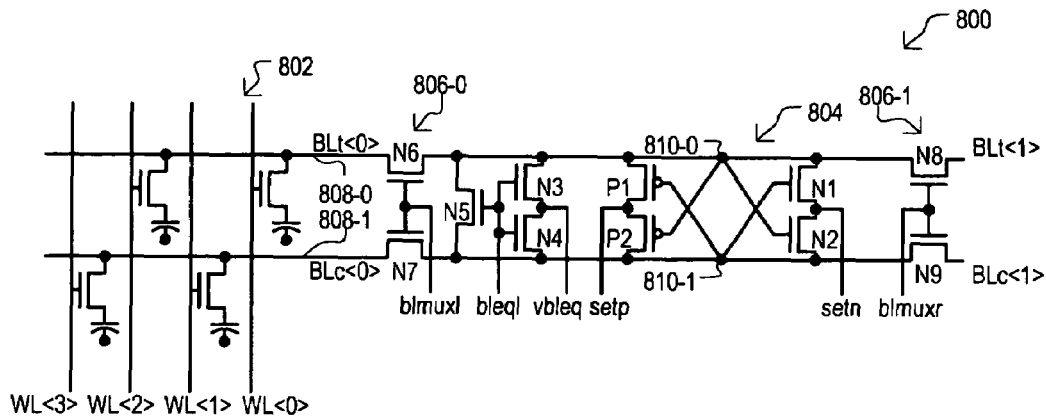
FIG. 8 is a schematic diagram of a conventional memory device.
Figure 9:
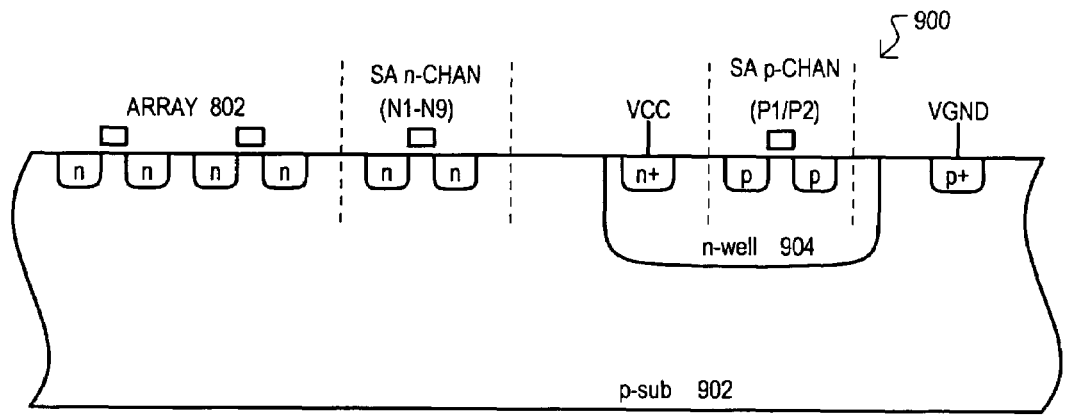
FIG. 9 is a side cross sectional view illustrating the biasing arrangement of the conventional memory device of FIG. 8.
Figure 10:
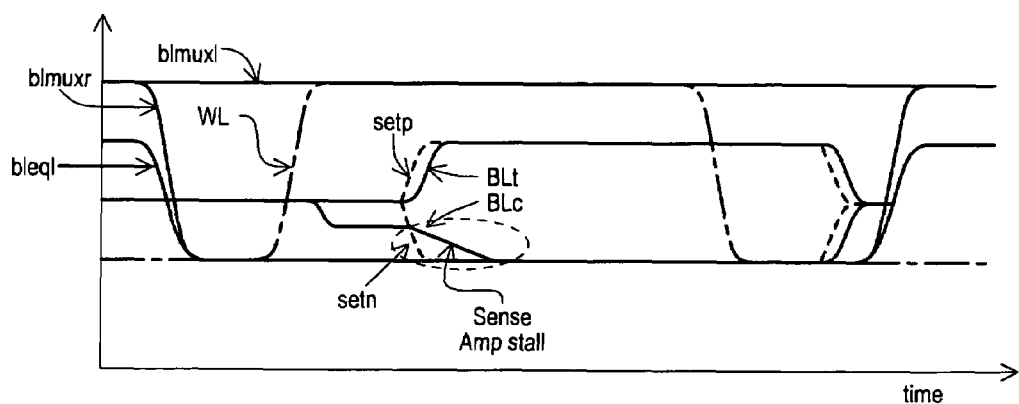
FIG. 10 is a timing diagram showing a conventional sensing operation of the conventional memory device of FIG. 8.

In FIG. 3, a drive high section 302 can include two p-channel transistors, P30 and P31, cross-coupled between sense amplifier nodes 308-0 and 308-1. Sources of transistors P30/P31 can receive a sense amplifier set signal "setp". In a sensing operation, signal setp can be driven to a high potential. Unlike conventional arrangements like that of FIG. 8, transistors P30/P31 can be body biased to a bias voltage VbiasP. It is understood that bias voltage VbiasP can be driven to a potential higher than a high power supply voltage VCC.

A drive low section 304 can include two n-channel transistors, N31 and N32, cross-coupled between sense amplifier nodes 308-0 and 308-1. Sources of transistors N31/N32 can receive a sense amplifier set signal "setn". Again, unlike conventional arrangements like that of FIG. 8, transistors N31/N32 can be body biased to a bias voltage VbiasN. It is understood that bias voltage VbiasN can be driven to a potential lower than a low power supply voltage VGND.

An equalization section 306 can include three n-channel transistors, N33 to N35. Transistors N33 and N34 can have source-drain paths coupled in series between sense amplifier nodes 308-0 and 308-1. Sources of transistors N33/N34 can receive an equalization voltage "vbleq". Transistor N35 can have a source-drain path coupled between nodes 308-0 and 308-1. Gates of transistors N33 to N35 can receive an equalization signal "bleql". A signal bleql can be driven high in an equalization operation, and low in a sense operation. Unlike conventional arrangements like that of FIG. 8, transistors N33-N35 can be body biased to the bias voltage VbiasN.

FIG. 3 also shows bit line multiplexers (BL MUXs) 310-0 and 310-1 that can connect bit line pairs (BLt<1>/BLc<1> or BLt<0>/BLc<0>) to sense amplifier nodes 308-0 and 308-1. Further, FIG. 3 shows a memory cell array 312 connected to bit line pair (BLt<0>/BLc<0>). Another memory cell array (not shown) can also be connected to bit line pair (BLt<1>/BLc<1>).

In this way, body biasing of sense amplifier transistors can be used to address adverse affects of variations in manufacturing process, temperature and/or operating voltage.

Figure 4A:
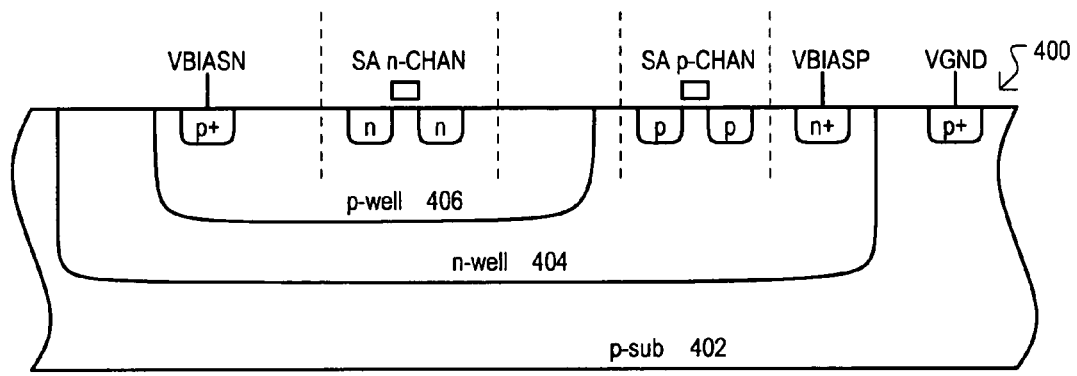

Referring now to FIGS. 4A to 4D a series of cross sectional views are presented showing some of the possible biasing arrangements that can be employed in a sense amplifier circuit. FIG. 4A shows a side cross sectional view of a semiconductor memory device 400 that includes a p-type substrate 402, a n-type well 404, and a p-type well 406 formed within the n-type well 404. A p-type substrate 402 can be biased to a low power supply voltage VGND. It is understood that n-channel transistors (not shown) for logic circuits, or the like, can be formed within such a substrate and thus be body biased to a low supply voltage VGND. In addition, n-wells (not shown) can be formed in the p-type substrate 402 that are biased to a high supply voltage VCC. P-channel transistors for logic circuits, or the like, can be formed in such wells and thus have bodies biased to a high supply voltage VCC.

Referring still to FIG. 4A, an n-type well 404 can be biased according to a bias voltage VBIASP. Such a well can include p-channel driver transistors (e.g., P30/P31 of FIG. 3). Thus, as an operating condition (e.g., temperature, operating voltage) falls outside a predetermined range (e.g., below some limit), a bias voltage VBIASP can be forced above a power supply voltage VCC, thus improving the performance of the sense amplifier circuit.

In a similar fashion, a p-type well 406 can be biased according to a bias voltage VBIASN. Such a well can include n-channel driver transistors (e.g., N31/N32 and/or N33 to N35). Thus, as an operating condition (e.g., temperature, operating voltage) falls outside a predetermined range (e.g., below some limit), a bias voltage VBIASN can be forced below a low supply voltage VGND, thus improving the performance of the sense amplifier circuit.

Figure 4B:
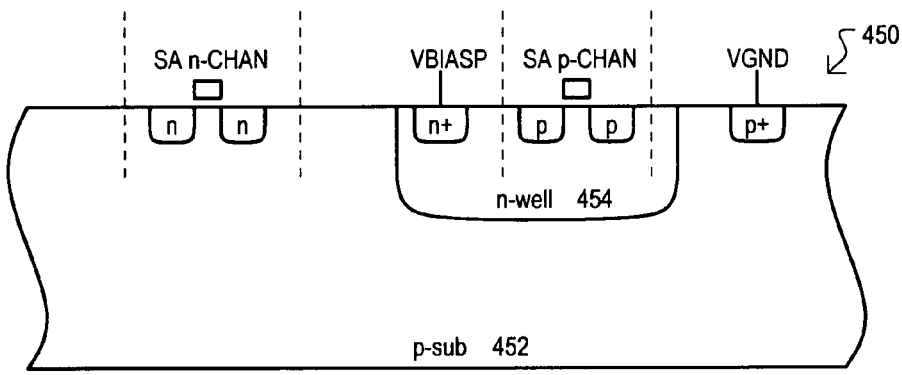

FIG. 4B shows another side cross sectional view of a semiconductor memory device 450 that includes a p-type substrate 452 and an n-type well 454. FIG. 4B shows an arrangement in which only p-channel transistors (e.g., P30/P31) of a sense amplifier are body biased to VBIASP, which can vary as described above for FIG. 4A. Accordingly, n-channel transistors of a sense amplifier (e.g., N31/N32 or N33 to N35) can be formed in p-type substrate 452 and thus be body-biased to a low power supply voltage VGND.

Figure 4C:
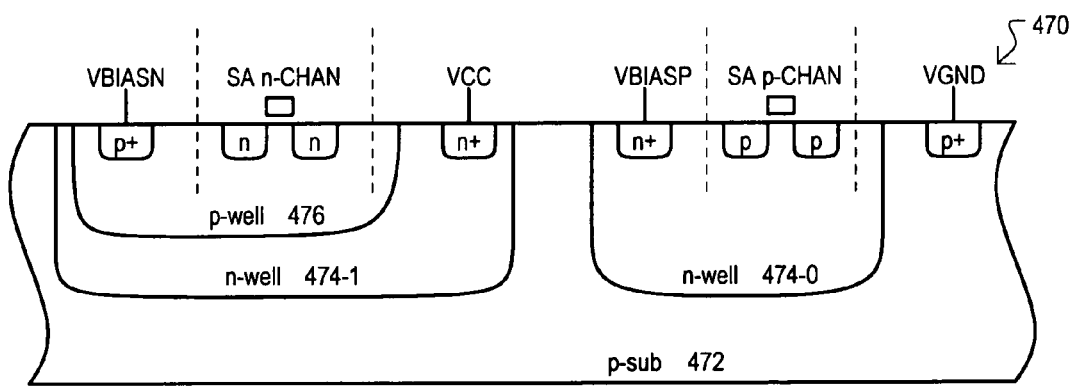

FIG. 4C shows an arrangement similar to that of FIG. 4A. FIG. 4C differs from that of FIG. 4A in that p-channel devices of a sense amplifier can be formed in an n-well 474-0 that is separate from an n-well 474-1 that contains a p-well 476 for the n-channel transistors of the sense amplifier circuit. Further, p-well 474-1 can be biased to VCC and not bias voltage VBIASP.

FIG. 4D shows an arrangement similar to that of FIG. 4C. FIG. 4D differs from that of FIG. 4C in that p-channel devices (e.g., P30/P31) can be formed in an n-well 494-0 that is separate from two other n-wells 494-1 and 494-2. N-well 494-1 can be biased to a high supply voltage VCC and contain a p-well 496-0. P-well 496-0 can contain n-channel pull-down transistors (e.g., N31/N32) and can be biased to a bias voltage VBIASN1. N-well 494-2 can also be biased to a high supply voltage VCC and contain a p-well 496-1. P-well 496-1 can contain n-channel equalization transistors (e.g., P33-P35) and can be biased to a bias voltage VBIASN2. Bias voltages for the n-channel transistors (VBIASN1 and VBIASN2) may be the same, or may be different. However, both such bias voltages can be driven below a low power supply voltage VGND in response to variations in one or more operating conditions of the device.

Of course FIGS. 4A to 4D represent but a few of the many possible variations on biasing sense amplifier transistors according to the embodiments, and should not necessarily be construed as limiting to the invention.

Referring now to FIGS. 5, 6A and 6B, one example of a condition sense section will be described. FIG. 5 is a block schematic diagram of a condition sense circuit 500 and FIGS. 6A and 6B are graphs showing possible responses of a condition sense circuit. The very particular condition sense circuit 500 of FIG. 5 includes a detect circuit 502, a first bias pump circuit 504, and a second bias pump circuit 506. A detect circuit 502 can monitor a state of a semiconductor memory device and provide output values T1 and T2 in response. For example, a detect circuit 502 can include a self-biased capacitor charge/discharge circuit, in which the capacitor potential can be compared to high and low limits. When a capacitor potential exceeds a high limit, a discharge circuit can be enabled, and when the capacitor potential falls below a low limit, a charge circuit can be enabled. The rate at which such charge/discharge operations take place can reflect an operating condition (e.g., temperature) of the semiconductor memory device.

A first pump circuit 504 can be a conventional positive bias charge pump. According to a value T1, a bias voltage VBIASP can be generated. Similarly, a second pump circuit 506 can be a conventional negative bias charge pump. According to a value T2, a bias voltage VBIASN can be generated.

As noted above, bias voltages (e.g., VBIASN and VBIASP) can be generated in a variety of ways. Two of the many possible ways are shown in FIGS. 6A and 6B. FIG. 6A shows a step-wise generation of a bias voltage. In particular, once an operating condition falls outside a predetermined range, a bias voltage can be generated and maintained at about one level. FIG. 6A shows the particular case in which, once a temperature is determined to be below a temperature (e.g., 0° C.), a bias voltage can be driven to a higher absolute value |VBIAS|. In contrast, FIG. 6B shows a gradual generation of a bias voltage. In particular, once an operating condition falls outside a predetermined range, a bias voltage can be generated that is in someway proportional to a condition (process, voltage, temperature) effect. FIG. 6B shows the particular case in which, once a temperature is determined to be below a temperature (e.g., 0° C.), a bias voltage |VBIAS| can increase as a determined temperature value decreases.

Of course, FIGS. 5, 6A and 6B represent but a few of the many possible examples of how bias voltages can be generated.

Figure 7:
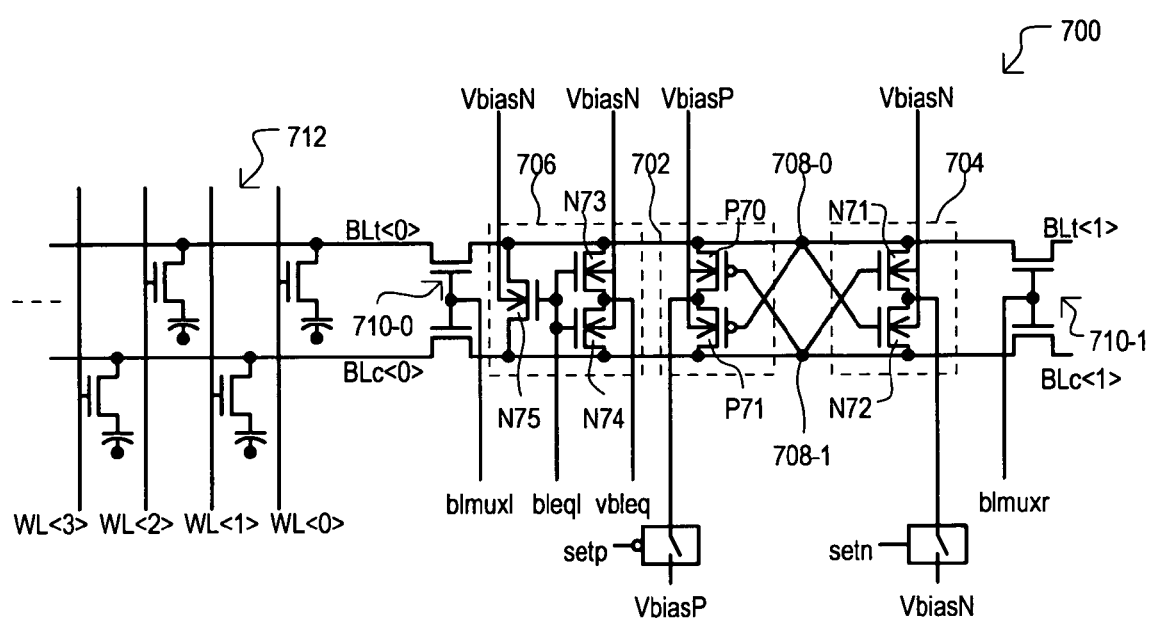
FIG. 7 is a schematic diagram showing a sense amplifier circuit according to another embodiment of the present invention.

Referring now to FIG. 7, a sense amplifier circuit according to another embodiment is shown in a schematic diagram. FIG. 7 shows the same general circuit components as FIG. 3, thus like sections are referred to by the same reference character but with the first digit being "7" instead of "3".

The sense amplifier circuit 700 of FIG. 7 differs from that of FIG. 3, in that bit lines can be driven to bias levels VBIASN and VBIASP in a sense operation.

In this way, in addition, to substrate biasing, drive high and drive low circuits can provide an "overdrive" response during a sensing operation.

Embodiments of the present invention disclosed above have show arrangements in which transistors, such as insulated gate field effect transistors, of a sense amplifier circuit can have threshold voltages (Vts) that are modulated according to a bulk biasing. It is believed such an arrangement can provide particularly beneficial results at low power and low temperature operations (e.g., 1.65 V, −40° C.). In particular, the various embodiments can address sense amplifier "stalls", and may be advantageously utilized in pseudo static random access memory (pSRAM) devices.

It is understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A semiconductor memory device, comprising:
    a drive high circuit that drives at least one bit line coupled to a plurality of memory cells toward a high sense voltage in a sense operation according to a sensed data value, the drive high circuit comprising at least one pull-up insulated gate field effect transistor (FET) of a first conductivity type having a body biased to a boosted high voltage;
    a logic section comprising a plurality of transistors of the first conductivity type having bodies biased to a high supply voltage; and
    a condition sense circuit that increases the boosted high voltage to a level above the high supply voltage when an operating condition is determined to be outside a predetermined limit, the operating condition being selected from the group consisting of an operating temperature, operating voltage, and manufacturing process variations.

2. The semiconductor memory device of claim 1, wherein:
    the drive high circuit comprises cross-coupled pull-up p-channel FETs, each pull-up PFET being formed within an n-well coupled to the boosted high voltage and having source-drain paths coupled between one bit line and the high sense voltage.

3. The semiconductor memory device of claim 1, further including:
    a drive low circuit that drives the at least one bit line toward a low sense voltage in a sense operation according to the sensed data value, the drive low circuit comprising at least one pull-down FET of a second conductivity type having a body biased to a first boosted low voltage;
    the logic section comprising a plurality of transistors of the second conductivity type having bodies biased to a low supply voltage; and
    the condition sense circuit decreases the boosted low voltage to a level below the low supply voltage when the operating condition is determined to be outside the predetermined limit.

4. The semiconductor memory device of claim 3, wherein:
    the drive low circuit comprises cross-coupled pull-down n-channel FETs, each pull-down NFET being formed within a p-well coupled to the boosted low voltage and having source-drain paths coupled between one bit line and the low sense voltage.

5. The semiconductor memory device of claim 1, further including:
    an equalization circuit that couples adjacent bit lines to an equalization voltage at a level between the high supply voltage and a low supply voltage, the equalization circuit includes at least one equalization FET of a second conductivity type having a body biased to a second boosted low voltage;

the logic section further includes a plurality of transistors of the second conductivity type having bodies biased to a low supply voltage; and the condition sense circuit decreases the boosted low voltage to a level below the low supply voltage when the operating condition is determined to be outside the predetermined limit.

6. The semiconductor memory device of claim 5, wherein:

the at least one equalization FET is formed within a p-well coupled to the boosted high voltage and has a source-drain path coupled between two bit lines.

7. A semiconductor memory device, comprising:

a sense amplifier circuit comprising first and second transistors of a first conductivity type cross coupled between sense amplifier nodes and formed in a first substrate section of a second conductivity type, first and second transistors of a second conductivity type cross coupled between the sense amplifiers nodes and formed in a second substrate section of a first conductivity type; and a bias voltage control circuit coupled to at least the first substrate section that varies a bias voltage to the first substrate section based on at least one operating condition of the semiconductor memory device.

8. The semiconductor memory device of claim 7, wherein:

the semiconductor memory device receives a low power supply voltage at an external connection;

the first and second transistors are n-channel insulated gate field effect transistors and the first substrate section is of a p-type conductivity; and the bias voltage control circuit is configured to vary the bias voltage to the first substrate section to a potential below the low power supply voltage.

9. The semiconductor memory device of claim 8, wherein:

the sense amplifier circuit further includes at least one equalization n-channel transistor formed in the first substrate section having a source-drain path coupled between the sense amplifier nodes.

10. The semiconductor memory device of claim 7, wherein:

the semiconductor memory device receives a high power supply voltage at an external connection;

the first and second transistors are p-channel insulated gate field effect transistors and the first substrate section is of an n-type conductivity; and the bias voltage control circuit is configured to vary the bias voltage to the first substrate section to a potential above the high power supply voltage.

11. The semiconductor memory device of claim 7, wherein:

the bias voltage control circuit varies the bias voltage to a level outside the range of received power supply voltages when a temperature is determined to be lower than a predetermined limit, the predetermined limit being less than or equal to 0° C.

12. The semiconductor memory device of claim 7, wherein:

the at least one operating condition is selected from the group consisting of: manufacturing process variations of the semiconductor memory device, operating voltage of the semiconductor memory device, and operating temperature of the semiconductor memory device.

13. The semiconductor memory device of claim 7, further including:

a bit line coupled to at least one of the sense amplifier nodes; and a plurality of dynamic random access memory (DRAM) cells coupled to the bit line, each DRAM cell including a storage capacitor and a pass transistor.

14. A method of activating a sense amplifier circuit of a semiconductor memory device, comprising the steps of:

sensing a condition of the semiconductor memory device; and modulating the threshold voltage of at least a first pair of sense transistors by biasing a substrate containing the first pair of sense transistors to a potential outside a power supply voltage range, the power supply voltage range being the range between a high power supply voltage and low power supply voltage received by the semiconductor memory device at external connections, the first pair of sense transistors being cross coupled between sense nodes of a sense amplifier.

15. The method of claim 14, wherein:

the step of sensing a condition of the semiconductor memory device includes determining that a temperature of the semiconductor memory device is below a predetermined limit.

16. The method of claim 14, wherein:

modulating the threshold voltage includes biasing the substrate containing the first pair of sense transistors to a potential below the low power supply voltage.

17. The method of claim 14, wherein:

modulating the threshold voltage includes biasing the substrate containing the first pair of sense transistors to a potential above the high power supply voltage.

18. The method of claim 14, further including:

modulating the threshold voltage of a second pair of sense transistors of a different conductivity type than the first pair of sense transistors by biasing a substrate containing the second pair of sense transistors to another potential outside the power supply voltage range.

19. The method of claim 14, further including:

modulating the threshold voltage of at least one equalization transistor by biasing a substrate containing the at least one equalization transistor to a potential outside a power supply voltage range, the at least one equalization transistor having a source-drain path coupled between the nodes of the sense amplifier.

20. The method of claim 14, further including:

biasing a substrate of the semiconductor memory device containing a plurality of dynamic random access memory (DRAM) cells independently of the substrate containing the first pair of sense transistors.

* * * * *